US007391082B2

(12) United States Patent
Shin et al.

(10) Patent No.: US 7,391,082 B2
(45) Date of Patent: Jun. 24, 2008

(54) SEMICONDUCTOR INTEGRATED CIRCUIT HAVING RESISTOR

(75) Inventors: Jin-Hyun Shin, Suwon-si (KR); Kwang-Jae Lee, Suwon-si (KR); Sung-Nam Chang, Seoul (KR); Wang-Chul Shin, Osan si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 207 days.

(21) Appl. No.: 11/338,754

(22) Filed: Jan. 25, 2006

(65) Prior Publication Data

US 2006/0163666 A1 Jul. 27, 2006

(30) Foreign Application Priority Data

Jan. 27, 2005 (KR) ..................... 10-2005-0007706

(51) Int. Cl.
*H01L 23/62* (2006.01)

(52) U.S. Cl. ........................ 257/351; 257/358; 257/379; 257/516

(58) Field of Classification Search ................. 257/350, 257/351, 358, 363, 379, 516, 536
See application file for complete search history.

(56) References Cited

U.S. PATENT DOCUMENTS

| | | | | |
|---|---|---|---|---|
| 4,609,835 | A * | 9/1986 | Sakai et al. | 326/102 |
| 5,629,553 | A * | 5/1997 | Ikeda et al. | 257/531 |
| 6,759,729 | B1 * | 7/2004 | Racanelli et al. | 257/536 |
| 2005/0218470 | A1 * | 10/2005 | Ohkubo et al. | 257/467 |
| 2006/0145296 | A1 * | 7/2006 | Coolbaugh et al. | 257/536 |

FOREIGN PATENT DOCUMENTS

| | | |
|---|---|---|
| JP | 2003-045980 | 2/2003 |
| KR | 1999-015776 | 3/1999 |
| KR | 1020020009829 | 2/2002 |

* cited by examiner

*Primary Examiner*—Fernando L Toledo
(74) *Attorney, Agent, or Firm*—Volentine & Whitt, PLLC

(57) ABSTRACT

A semiconductor integrated circuit having a resistor is disclosed in which the resistor is formed by a series connection of one element having a positive temperature coefficient and another element having a negative temperature coefficient.

14 Claims, 5 Drawing Sheets

110
106
102
100
104
108
120
122
124d
124s
126
128
130
132
134

SEMICONDUCTOR INTEGRATED CIRCUIT HAVING RESISTOR

BACKGROUND OF THE INVENTION

1. Field of the Invention

Embodiments of the invention relate to a semiconductor device. More particularly, embodiments of the invention relate to a semiconductor integrated circuit device comprising a resistor.

This application claims priority to Korean Patent Application No. 1005-000776 filed Jan. 27, 2005, the subject matter of which is hereby incorporated by reference in its entirety.

2. Description of the Related Art

The integrated circuits formed in semiconductor devices are combinations of electrically connected active elements (e.g., transistors and diodes) and passive elements (e.g., resistors and capacitors). By designed combinations of these basic elements, innumerable integrated circuits may be formed having various outputs and/or performing various functions.

Resistors may be formed as part of a semiconductor integrated circuit from a doped polysilicon layer or from a region of a semiconductor substrate containing diffused impurities. As illustrated in FIG. 1, a device isolation layer 12 may be formed on a semiconductor substrate to thereby define an active region. A resistor then may be formed on device isolation layer 12 from a patterned polysilicon layer 16 having a predetermined length, thickness, and width. Alternatively, the resistor may be formed from an impurity diffusion layer 14 having a predetermined doping concentration, diffusion depth and width, within the active region. Electrodes 17*a*, 17*b*, 18*a*, and 18*b* may be connected to opposite ends of polysilicon pattern 16 and impurity diffusion layer 14, respectively. In this manner, resistors R1 and R2 may be variously formed between corresponding electrodes.

The output and/or functionality of a semiconductor integrated circuit must be carefully designed in view of the totality of factors influencing its performance. An accurate definition of the performance and tolerance of individual components forming the semiconductor integrated circuit is an important part of this design process. Unfortunately, resistors, such as those described above, constituting the semiconductor integrated circuit have well understood performance variations in relation to changing temperature. This variability may be expressed by a corresponding temperature coefficient. As a practical outcome of temperature related performance variations by resistor elements, a semiconductor integrated circuit may suffer from output signal variation or functional variance due to an increase or decrease in temperature.

For example, a semiconductor memory device may read data from a memory cell by comparing the output voltage of the memory cell with a reference voltage. A reference voltage generating circuit will often generate the reference voltage using a combination of transistors and resistors. Therefore a change in the internal resistance of this circuit as a function of temperature may cause a change in the reference voltage, which may generate an error in reading the data. Such reference voltages are also required for writing data to a memory cell.

More specifically, read, write and erase operations applied to a flash memory device are typically performed by applying a reference voltage to a memory cell. Thus variances in the performance characteristics of one or more resistors used to generate the reference voltage may cause variance in these fundamental flash memory operations, including failed read, write and erase operations.

SUMMARY OF THE INVENTION

Embodiments of the invention provide a semiconductor integrated circuit comprising a resistor having a resistance less variable in relation to temperature changes.

Thus, in one embodiment, the invention provides a semiconductor integrated circuit comprising; a resistor formed from a diffusion resistance having a positive temperature coefficient (PTC) and a contact resistance having a negative temperature coefficient (NTC) are connected in series. The diffusion resistance may comprise an impurity diffusion layer formed in a semiconductor substrate or a doped polysilicon layer formed on the semiconductor substrate. The contact resistance may comprise a junction portion between a metal layer electrically connected with a diffusion resistance.

In another embodiment, the invention provides a semiconductor integrated circuit comprising; a first circuit and a second circuit formed on a semiconductor substrate, and a resistor electrically connecting the first circuit and the second circuit, wherein the resistor comprises a diffusion resistance having a positive temperature coefficient (PTC) and a contact resistance having a negative temperature coefficient (NTC) are connected in series. Here again, the diffusion resistance may comprise an impurity diffusion layer formed in a semiconductor substrate or a doped polysilicon layer formed on the semiconductor substrate. The contact resistance may comprise a junction portion between a metal layer electrically connected with a diffusion resistance.

BRIEF DESCRIPTION OF THE DRAWINGS

Several embodiments of the invention will be described with reference to the accompanying drawings. In the drawings, various layer thicknesses may be exaggerated for clarity. Like reference numerals in the drawings denote like or similar elements. In the drawings.

DESCRIPTION OF EXEMPLARY EMBODIMENTS

Reference will now be made in detail to several embodiments of present invention. However, the invention is not limited to only the described embodiments. It will also be understood that when a layer is referred to as being “on” another layer or substrate, it can be directly on the other layer or substrate, or intervening layers may also be present.

Figure 1:
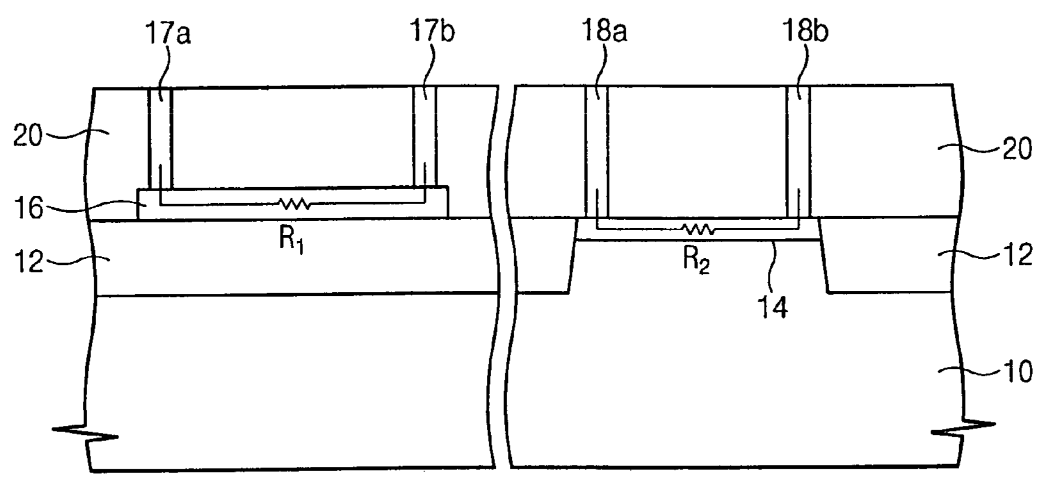
FIG. 1 is a sectional view of a conventional resistor.
Figure 2:
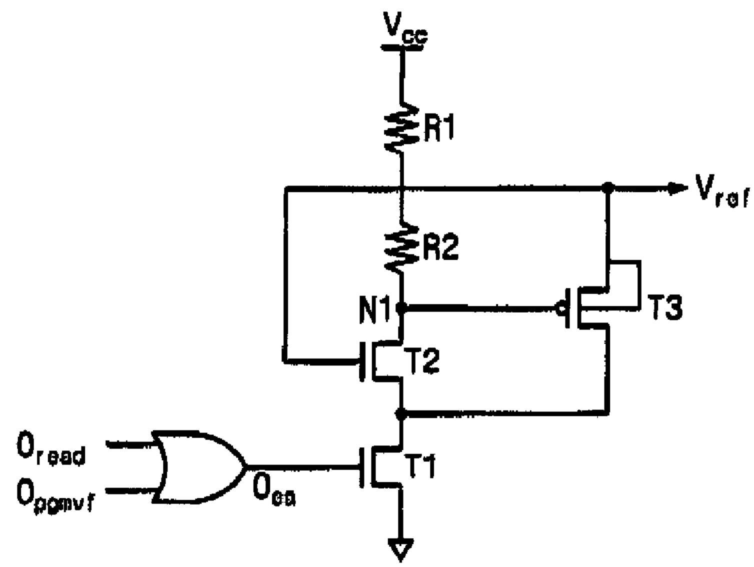
FIGS. 2 and 3 are equivalent circuit diagrams for respective, exemplary resistors adapted for use within a semiconductor integrated circuit.
Figure 3:
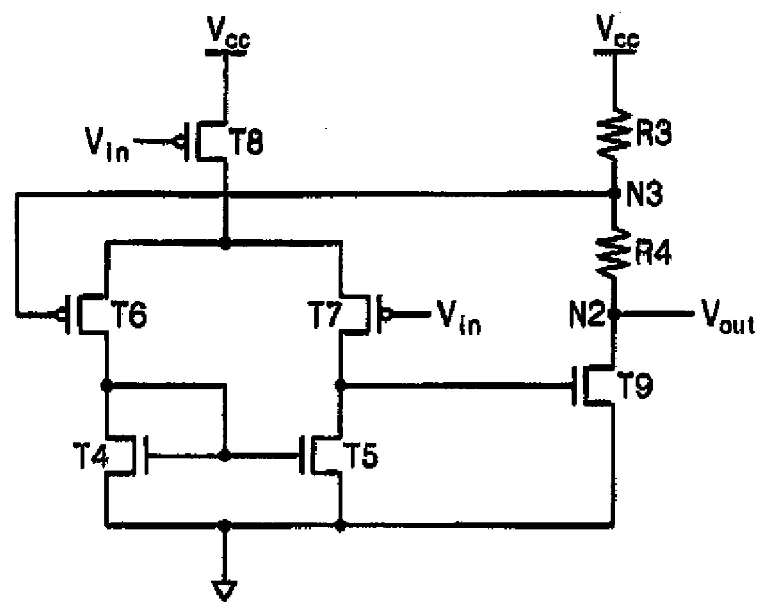

Referring to FIGS. 2 and 3, exemplary reference voltage generating circuits variously comprise a plurality of transistors T1 through T9 and a plurality of resistors R1 through R4. Referring for the moment to FIG. 2, when a read signal (Oread) and a program verifying signal (Opgmvf) are received in a NOR gate, a reference voltage (Vref) may be obtained from the illustrated circuit comprising transistors T1 through T3 and resistors R1 and R2. The NOR gate output is termed an output value (Oea) and is applied to transistor T1.

Referring now to FIG. 3, an input voltage (Vin) is received in the illustrated circuit and an output voltage (Vout) is generated. The reference voltage generating circuit comprises transistors T4 through T9 and resistors R3 and R4.

Referring collectively to FIGS. 2 and 3, the respective circuits connected with both sides of resistors R1 through R4 may be termed a "first circuit" and a "second circuit." For example, when resistor R2 is used as a reference, the loop connected with a node N1 and resistor R1 connected with a regulated power source (Vcc) may be termed the first circuit and second circuit, respectively. Also, when resistor R4 is used as a reference, a loop connected with a node N2 and a loop connected with a node N3 may be separately termed the first circuit and second circuit, respectively.

FIGS. 2 and 3 are mere exemplary equivalent circuit diagrams illustrating part of a semiconductor integrated circuit including a resistor. The teachings of the present invention may be applied to any resistor formed, for example, as part of a regulated power generating circuit, a reading voltage generating circuit, and/or a reference voltage generating circuit.

Figure 4:
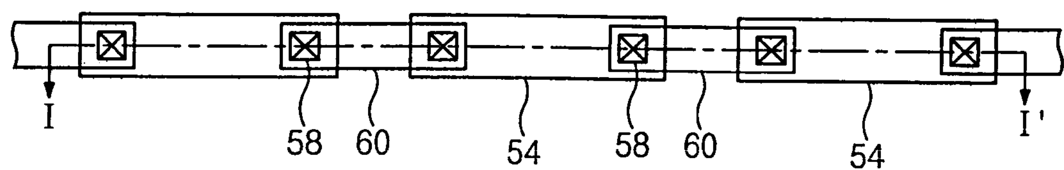
FIGS. 4 and 5 are sectional views of a resistor according to one embodiment of the invention.
Figure 5:
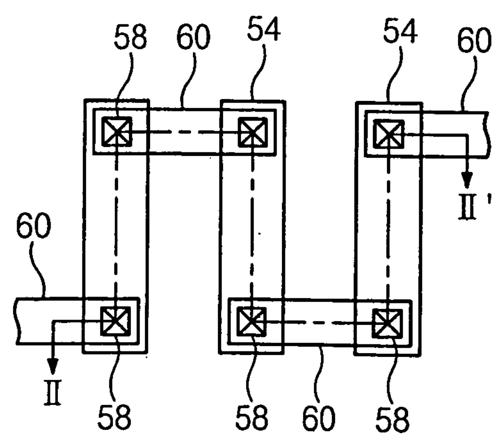

FIGS. 4 and 5 are respectively plan views illustrating a resistor according to one embodiment of the invention.

Referring to FIG. 4, a semiconductor integrated circuit comprises a resistor wherein the resistor comprises in combination: (1) one or more diffusion resistance(s) characterized by increasing resistance with temperature; and (2) one or more contact resistance(s) characterized by decreasing resistance with temperature. The diffusion resistance(s) may be formed from an impurity diffusion layer 54 formed by impurities being injected into an active region, as defined by a device isolation layer, of a semiconductor substrate. The contact (i.e., junction) resistance(s) may be formed by the use of one or more metal patterns 60 connecting separate impurity diffusion layers 54.

Those of ordinary skill in the art will see at this point, that one or more impurity diffusion layers and one or more metal patterns may be appropriately combined to produce a resistance that remains remarkably stable across a range of expected temperatures. That is, a temperature coefficient may be designed for a resistor element using a combination of diffusion resistance contact resistance elements.

The resistance of respective impurity diffusion layers 54 may be controlled by selectively determining the width, length, contact depth, type of impurity, and doping concentration for the impurity. The resistance of the resulting resistor may further be controlled by the selective incorporation of respective metal patterns 60 connecting the impurity diffusion layers 54. By doing this, it is possible to appropriately control the diffusion resistance for the one or more impurity diffusion layers 54 and the contact resistance provided by one or more metal patterns 60 within a series of impurity diffusion layers 54.

With this configuration, as temperature falls, the diffusion resistance(s) formed by the impurity diffusion layer(s) having relatively scattered impurities tend to decrease in resistance. On the contrary, as temperature falls, the contact resistance having a relatively high potential barrier tends to increase in resistance. That is, the diffusion resistance has a positive temperature coefficient (PTC) where resistance changes in proportion to temperature, and the contact resistance has a negative temperature coefficient (NTC) where resistance changes in inverse proportion to temperature. Therefore, it is possible to form a compound resistor exhibiting relatively small resistance change to temperature by appropriately combining diffusion resistance(s) and contact resistance(s), such that the PTC of the diffusion resistance(s) and the NTC of the contact resistance(s) are mutually canceled.

Table 1 shows resistance change with respect to temperature for a resistor formed in accordance with one embodiment of the invention.

TABLE 1

| | 80° C. | −20° C. | Rate of change |
|---|---|---|---|
| Diffusion resistance (Ω/□) | 227.8 | 195 | 85.6% |
| Polysilicon resistance (Ω/□) | 201.6 | 177.9 | 88.2% |
| Present invention (Ω) | 286.6 | 274 | 95.6% |

The diffusion resistance is surface resistance for a 1 μm×1 μm area and the polysilicon resistance is surface resistance for a 0.6 μm×0.6 μm area. The illustrated embodiment of the invention shows resistance of a unit resistor where contact patterns having a 0.2 μm×0.2 μm area formed at an interval of 2.8 μm from an impurity diffusion layer having the width of 2 μm. Referring to Table 1, as the temperature falls from 80° C. to −20° C., the resistance of the diffusion resistance and the polysilicon resistor decrease by 86.6% and 88.2%, respectively. On the contrary, the resistance of the exemplary resistor according to an embodiment of the invention decreases by 95.6%, thereby showing relatively small resistance change compared with the diffusion resistance and the polysilicon resistor. When the ratio of the contact resistances is raised and the ratio of the diffusion resistance is lowered in the resistor pattern of the present invention used in Table 1, it is possible to minimize resistance reduction depending on temperature. Though the ratio of the diffusion resistances over the contact resistances may be calculated mathematically using the respective temperature coefficients, it is also possible to find out an appropriate ratio experimentally by variously classifying the impurity diffusion layers and the metal patterns (contact patterns) connected with the impurity diffusion layers in an actual manufacturing process.

Though a resistor formed in accordance with an embodiment of the invention may be formed with a straight linear shape (e.g., FIG. 4), it may alternatively be formed in a zigzag shape, as shown for example in FIG. 5. That is, the shape of the resistor may be modified according to the arrangement of unit elements such as other passive elements and active elements so as to minimize the area occupied by the resistor in the context of the overall layout of a semiconductor integrated circuit.

Figure 6:
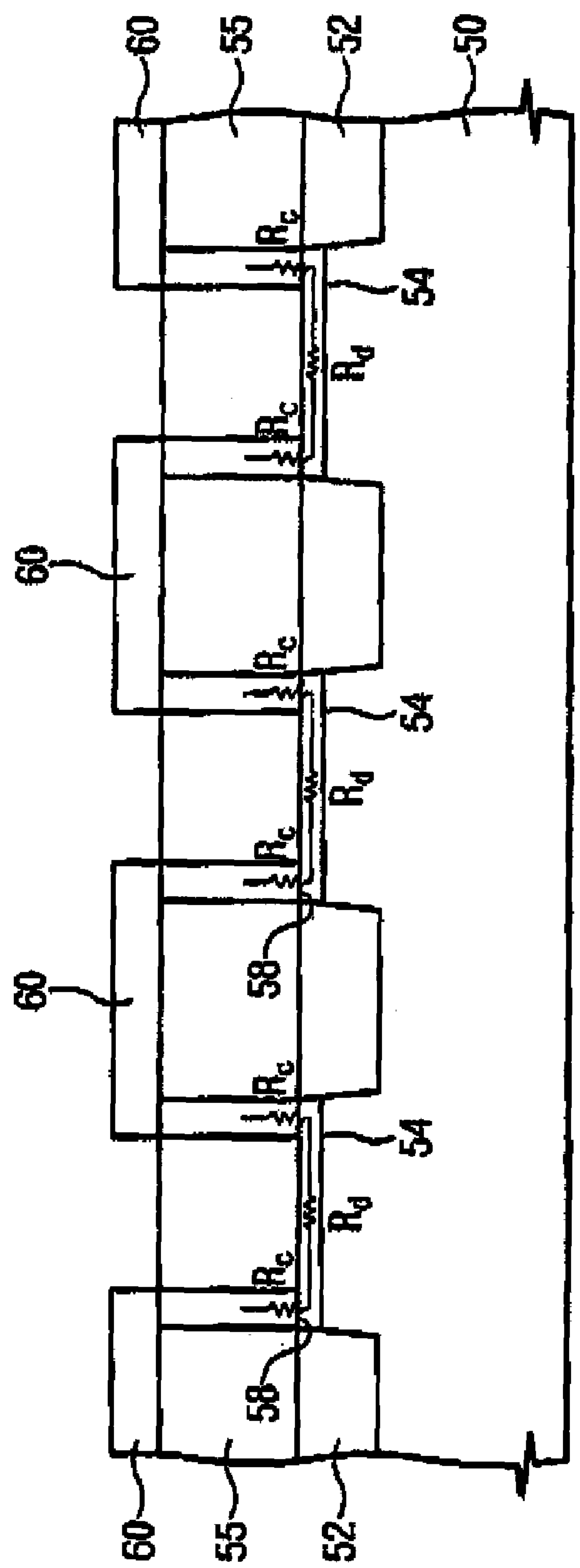
FIG. 6 is a sectional view taken along a line I-I' of FIG. 4 and a line II-II' of FIG. 5.

FIG. 6 is a sectional view taken along a line I-I' of FIG. 4 and a line II-II' of FIG. 5.

Referring to FIG. 6, a diffusion resistance (Rd) and a contact resistance (Rc) may be provided by impurity diffusion layers 54 formed on or in a semiconductor substrate 50, and a junction of metal patterns 60 connected with the impurity diffusion layers 54. In some additional detail, a device isolation layer 52 is formed in the semiconductor substrate 50 to define a plurality of active regions and impurities are injected into the active regions to form impurity diffusion layers 54 spaced from each other. An interlayer-insulation layer 55 is formed on the semiconductor substrate in which impurity diffusion layers 54 are formed, and via portions 58 of metal patterns 60 passing through the interlayer-insulation layer 55 and electrically connected with both ends of impurity diffusion layers 54. The plurality of impurity diffusion regions 54 and the plurality of metal patterns 60 are serially connected, so that a resistor wherein diffusion resistances (Rd) are connected in series between contact resistances (Rc) is formed. It is possible to easily control resistance by making in a unit the width of the contact surface of metal patterns 60 and impurity diffusion regions 54 and the contact interval thereof. Metal patterns 60 connected with both ends of the resistor are electrically connected with active elements and passive elements such as other neighboring transistors and resistors to form a semiconductor integrated circuit.

Figure 7:
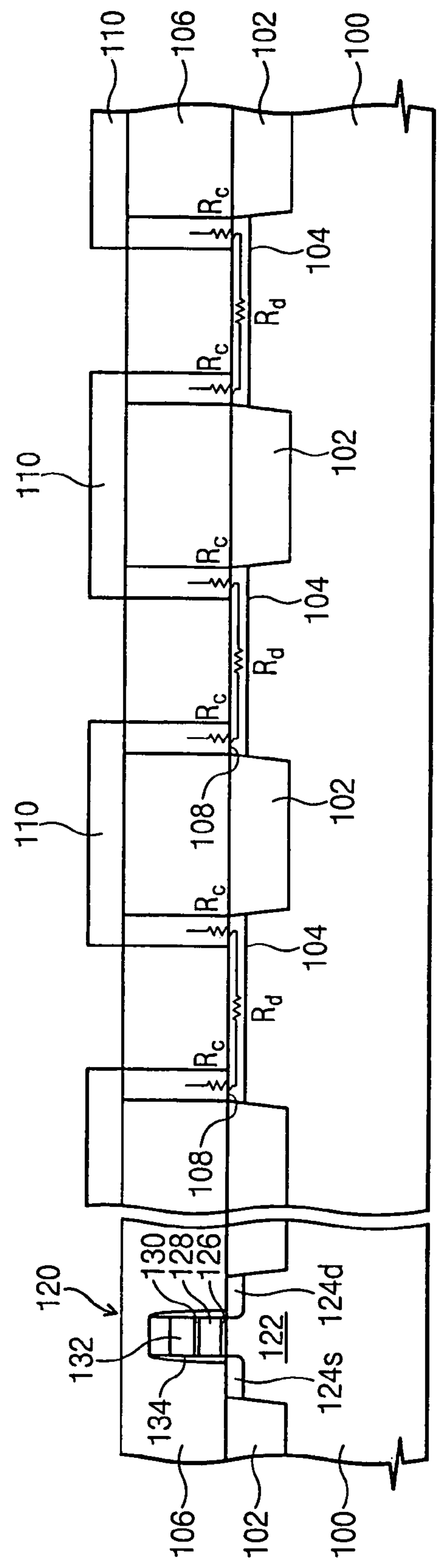
FIG. 7 is a sectional view of a semiconductor integrated circuit according to one embodiment of the invention.

FIG. 7 is a sectional view of a semiconductor integrated circuit according to another embodiment of the invention as applied to a non-volatile memory device.

Referring to FIG. 7, a device isolation layer 102 is formed in a semiconductor substrate 100 to define an active region. A resistor formed from impurity diffusion layers 104 formed in active region, as a diffusion resistance (Rd) and a junction portion 108 of metal patterns 110 passing through an interlayer-insulation layer 106 and connected with impurity diffusion layers 104, as a contact resistance (Rc), is formed. A stacked gate pattern 120 comprising a floating gate 128, an inter-gate layer-dielectric layer 130, and a floating gate electrode 132 is formed on a channel region between a source region 124*s* and a drain region 124*d* formed in an active region 122. Stacked gate pattern 120 constitutes a unit cell of a non-volatile memory device. As described above, the present invention may also be applied to part of a reference voltage generator for applying a reference voltage to a unit cell of a non-volatile memory device.

According to embodiments of the invention, it is possible to manufacture a resistor showing relatively small resistance change with respect to temperature by serially connecting a diffusion resistance having a PTC and a contact resistance having a NTC. A semiconductor integrated circuit including such a resistor will provide stable functionality and output signals in the face of temperature changes.

It will be apparent to those skilled in the art that various modifications and variations may be made to the foregoing embodiments. Thus, it is intended that the scope of the invention, as defined by the following claims, will cover all such modifications and variations and their equivalents.

What is claimed is:

1. A semiconductor device comprising:

a resistor comprising a diffusion resistance formed by an impurity diffusion layer formed in a semiconductor substrate and having a positive temperature coefficient (PTC) and a contact resistance formed by a metal pattern formed on an interlayer-insulation layer formed on the semiconductor substrate and having a negative temperature coefficient (NTC), wherein the diffusion resistance and contact resistance are connected in series.

2. The device of claim 1, wherein the impurities are N-type impurities or P-type impurities.

3. The device of claim 1, wherein the contact resistance is electrically connected to the diffusion resistance by a via portion of metal pattern passing through the interlayer-insulation layer.

4. The device of claim 1, wherein the series connection of the diffusion resistance and contact resistance form in a straight linear shape.

5. The device of claim 1, wherein the series connection of the diffusion resistance and contact resistance form a zigzag shape.

6. A semiconductor integrated circuit comprising:

a first circuit and a second circuit formed on a semiconductor substrate; and a resistor electrically connecting the first circuit and the second circuit, wherein the resistor comprises a diffusion resistance formed by an impurity diffusion layer formed in the semiconductor substrate and having a positive temperature coefficient (PTC) and a contact resistance formed by a metal pattern formed on an interlayer-insulation layer formed on the semiconductor substrate and having a negative temperature coefficient (NTC), wherein the diffusion resistance and contact resistance are connected in series.

7. The circuit of claim 6, wherein the impurities comprise at least one of N-type impurities and P-type impurities.

8. The circuit of claim 6, wherein the series connection of the diffusion resistance and contact resistance forms a straight linear shape.

9. The circuit of claim 6, wherein the series connection of the diffusion resistance and contact resistance forms a zigzag shape.

10. The device of claim 3, wherein the impurity diffusion layer overlaps the metal pattern only in the via portion of the metal pattern.

11. The circuit of claim 6, wherein the impurity diffusion layer is electrically connected to the metal pattern by a via portion of the metal pattern passing through the interlayer-insulation layer, and the impurity diffusion layer overlaps the metal pattern only in the via portion of the metal pattern.

12. A semiconductor device, comprising:

a plurality of device isolation layers formed in a semiconductor substrate to define a linear arrangement of active regions;

a plurality of diffusion resistances, each respectively formed in relation to one of the active regions;

an interlayer-insulation layer formed on the semiconductor substrate;

a plurality of contact resistances formed from metal patterns arranged between and electrically connecting adjacent ones of the plurality of diffusion regions, wherein each one of the metal patterns comprises a portion formed on the interlayer-insulation layer and corresponding via portions connecting the adjacent ones of the plurality of diffusion resistances through the interlayer-insulation layer, such that the plurality of diffusion resistances and the plurality of contact resistances overlap only in regions defined by the respective via portions.

13. The semiconductor device of claim 12, wherein the plurality of diffusion resistances is formed from a plurality of impurity diffusion regions respectively formed in the active regions.

14. The semiconductor device of claim 12, wherein the plurality of diffusion resistances is formed from a plurality of doped polysilicon regions respectively formed on the surface of the semiconductor substrate in the active regions.

* * * * *